United States Patent
Huang et al.

(10) Patent No.: US 11,616,336 B2
(45) Date of Patent: Mar. 28, 2023

(54) ERBIUM-DOPED SILICATE CRYSTALS AND 1.5 μM LASERS USING THE SAME

(71) Applicant: FUJIAN INSTITUTE OF RESEARCH ON THE STRUCTURE OF MATTER, Fujian (CN)

(72) Inventors: Yidong Huang, Fujian (CN); Yujin Chen, Fujian (CN); Guoliang Gong, Fujian (CN); Jianhua Huang, Fujian (CN); Yanfu Lin, Fujian (CN); Xinghong Gong, Fujian (CN); Zundu Luo, Fujian (CN)

(73) Assignee: FUJIAN INSTITUTE OF RESEARCH ON THE STRUCTURE OF MATTER, CHINESE ACADEMY OF SCIENCES, Fujian (CN)

(*) Notice: Subject to any disclaimer, the term of this patent is extended or adjusted under 35 U.S.C. 154(b) by 413 days.

(21) Appl. No.: 16/643,746

(22) PCT Filed: Aug. 21, 2018

(86) PCT No.: PCT/CN2018/101587
§ 371 (c)(1),
(2) Date: Mar. 2, 2020

(87) PCT Pub. No.: WO2019/042191
PCT Pub. Date: Mar. 7, 2019

(65) Prior Publication Data
US 2020/0280163 A1 Sep. 3, 2020

(30) Foreign Application Priority Data
Sep. 1, 2017 (CN) .......................... 201710780466.1

(51) Int. Cl.
*H01S 3/16* (2006.01)
*C30B 29/34* (2006.01)
*H01S 3/091* (2006.01)
*H01S 3/109* (2006.01)
(Continued)

(52) U.S. Cl.
CPC ............ *H01S 3/1608* (2013.01); *C30B 29/34* (2013.01); *H01S 3/091* (2013.01); *H01S 3/1095* (2013.01);
(Continued)

(58) Field of Classification Search
CPC .... H01S 3/1095; H01S 3/1608; H01S 3/1618; H01S 3/1655
See application file for complete search history.

(56) References Cited

U.S. PATENT DOCUMENTS

| | | | | |
|---|---|---|---|---|
| 5,265,116 A * | 11/1993 | Mooradian | ......... | H01S 3/09415 372/71 |
| 5,381,428 A * | 1/1995 | McMahon | ............. | H01S 3/109 372/71 |
| 5,733,371 A * | 3/1998 | Hashio | .................... | C30B 15/00 117/200 |

FOREIGN PATENT DOCUMENTS

| CN | 1648290 A | 8/2005 |
|---|---|---|
| CN | 1676680 A | 10/2005 |

(Continued)

OTHER PUBLICATIONS

Zhang, "Growth, thermal and laser properties of a new self-frequency-doubling Yb:CNGS crystal," 2016, CrystEngCom, 18, p. 5338-5343. (Year: 2016).*

(Continued)

*Primary Examiner* — Michael Carter
(74) *Attorney, Agent, or Firm* — Novick, Kim & Lee, PLLC; Allen Xue

(57) ABSTRACT

A class of erbium-doped silicate crystals have a general chemical formula of $(Er_xYb_yCe_zA_{(1-x-y-z)})_3RM_3Si_2O_{14}$, in which the range of x is 0.002 to 0.02, y is 0.005 to 0.1, and z is 0 to 0.15; A is one, two or three elements selected from Ca, Sr, or Ba; R is one or two elements selected from Nb or Ta; M is one or two elements selected from Al or Ga. Using one of such crystals as a gain medium and a diode laser at 940 nm or 980 nm as a pumping source, a 1.5 μm continu- (Continued)

ous-wave solid-state laser with high output power and high efficiency, as well as a pulse solid-state laser with high energy and narrow width can be obtained.

24 Claims, 2 Drawing Sheets

(51) Int. Cl.
    *H01S 3/1106*     (2023.01)
    *H01S 3/117*     (2006.01)
(52) U.S. Cl.
    CPC ............ *H01S 3/1106* (2013.01); *H01S 3/117* (2013.01); *H01S 3/1618* (2013.01); *H01S 3/1655* (2013.01)

(56) References Cited

FOREIGN PATENT DOCUMENTS

| CN | 101377015 | * | 3/2009 |
|---|---|---|---|
| CN | 101588009 | * | 11/2009 |
| CN | 101588009 A | | 11/2009 |
| CN | 103249805 A | | 8/2013 |
| CN | 105063755 A | | 11/2015 |
| CN | 106801257 | * | 6/2017 |
| CN | 106801257 A | | 6/2017 |

OTHER PUBLICATIONS

Lan, "Raman scattering spectra of $Ca_3NbGa_3Si_2O_{14}$ (CNGS) crystals," 2005, phys. stat. so. (b), 242, No. 10, pp. 1196-2004. (Year: 2005).*
Xuzhao Zhang et al., "Growth, thermal and laser properties of a new self-frequency-doubling Yb:CNGS crystal", CrystEngComm, 2016, vol. 18, No. 28, p. 5338-5343.
Xiaotong Zhang et al., "Growth and optical properties of a new CGG-type laser crystal $Nd^{3+}$:CNGS", Optical Materials Express, 2015, vol. 5, No. 5, pp. 977-985.

* cited by examiner

ERBIUM-DOPED SILICATE CRYSTALS AND 1.5 μM LASERS USING THE SAME

TECHNICAL FIELD

The disclosure relates to the field of solid-state laser materials and solid-state lasers, and particularly to a class of erbium-doped silicate crystals and 1.5 μm lasers using the same.

BACKGROUND ART

At present, efficient eye-safe 1.5 μm laser operation scan only be realized in a few kinds of erbium-ytterbium co-doped silicate crystals, such as orthosilicates (e.g. $Y_2SiO_5$ and $Sc_2SiO_5$), pyrosilicates (e.g. $Lu_2Si_2O_7$), and $Ca_2Al_2SiO_7$, etc. The high melting points of the above-mentioned crystals lead to relatively high crystal growth temperatures for the Czochralski method, for example, about 1600° C. for the $Ca_2Al_2SiO_7$ crystals, about 1900 to 2000° C. for the orthosilicate and pyrosilicate crystals. The high crystal growth temperatures not only impose requirements on crystal growth equipment and increase the growth costs, but also easily cause the volatilization of components from the melts in the growth processes, therefore high optical quality crystals are difficult to be grown. In addition, because the fluorescence lifetime of the $^4I_{11/2}$ level of $Er^{3+}$ ion in erbium-ytterbium co-doped $Ca_2Al_2SiO_7$ crystals is longer than 40 μs, most of $Er^{3+}$ ions cannot be rapidly populated in the upper laser level $^4I_{13/2}$, resulting in that the operating efficiency of a 1.5 μm laser is only 2.7%. Therefore, in order to improve the operating efficiency of the laser, it is necessary to introduce $Ce^{3+}$ ions into the erbium-ytterbium co-doped $Ca_2Al_2SiO_7$ crystals for shortening the fluorescence lifetime of the $^4I_{11/2}$ level of $Er^{3+}$ ions through the phonon-assisted energy transfer $Er^{3+}$ $(^4I_{11/2})+Ce^{3+}$ $(^2F_{5/2}) \rightarrow Er^{3+}$ $(^4I_{13/2})+Ce^{3+}$ $(^2F_{7/2})$.

Due to the advantages of stable physical and chemical properties, a thermal conductivity of about 2.0 $Wm^{-1}K^{-1}$, a nearly isotropic thermal expansion coefficient (5.49-5.92× $10^{-6}$ $K^{-1}$), and a non-central symmetric structure; $A_3RM_3Si_2O_{14}$ crystals (A=Ca, Sr, Ba; R=Nb, Ta; M=Al, Ga) have been considered as good nonlinear optical and laser matrix crystals. Because they melt congruently at 1300° C., the crystals with large size and high optical quality can be grown by the Czochralski method with short growth period and low cost. It has been reported that $Ca_3NbGa_3Si_2O_{14}$ crystals singly-doped with $Nd^{3+}$ or $Yb^{3+}$ ions have been used as 1.0 μm laser materials (see CrystEngComm, 2016, Vol. 18, No. 28, p. 5338-5343 and Opt. Mat. Express, 2015, Vol. 5, No. 5, p. 977-985). However, there has not been any research report on $Er^{3+}$ ion doped $A_3RM_3Si_2O_{14}$ crystal still now; especially, the relevant spectroscopic parameters required for determining whether this kind of crystals are suitable to be used as erbium-ytterbium co-doped laser materials at 1.5 μm have neither been reported.

SUMMARY OF THE INVENTION

In order to solve the above problems, the invention provides a class of $Er^{3+}$ ion doped silicate crystals, which can be used as gain media to obtain 1.5 μm continuous-wave solid-state lasers with high output power and high efficiency, as well as pulse solid-state lasers with high energy and narrow width.

The invention is realized by the following technical solutions: A class of erbium-doped silicate crystals, which has the general chemical formula of $(Er_xYb_yCe_zA_{(1-x-y-z)})_3RM_3Si_2O_{14}$, wherein the range of x is 0.002 to 0.02, y is 0.005 to 0.10, z is 0 to 0.15; A is one, two or three elements selected from Ca, Sr or Ba; R is one or two elements selected from Nb or Ta; M is one or two elements selected from Al or Ga.

The crystals belong to the trigonal crystal system, and their space groups are P321.

The invention further provides a method of preparing the above-mentioned erbium-doped silicate crystals, which are grown by the Czochralski method.

According to the invention, the method includes the following steps:

S1. mixing and grinding a compound containing Er element, a compound containing Yb element, a compound containing Ce element, a compound containing A element, a compound containing R element, a compound containing M element, and a compound containing Si element;

S2. sintering the ground mixture in step S1 to obtain a poly crystalline material;

S3. carrying out a crystal growth of the poly crystalline material obtained in step S2; wherein, the A, R, M are defined as described above;

according to the preparing method of the invention, in step S1, the compound containing Er element is selected from oxides of Er, such as $Er_2O_3$;

the compound containing Yb element is selected from oxides of Yb, such as $Yb_2O_3$;

the compound containing Ce element is selected from oxides of Ce, such as $CeO_2$;

the compound containing Si element is selected from oxides of Si, such as $SiO_2$;

the compound containing A element is selected from carbonates of A, such as one or two or more from $CaCO_3$, $SrCO_3$ or $BaCO_3$;

the compound containing R element is selected from oxides of R, such as one or two from $Nb_2O_5$ or $Ta_2O_5$;

the compound containing M element is selected from oxides of M, such as one or two from $Al_2O_3$ or $Ga_2O_3$;

the molar ratio of the compound containing Er element, the compound containing Yb element, the compound containing Ce element, the compound containing A element, the compound containing R element, the compound containing M element, and the compound containing Si element accords with the molar ratio of the elements in the $(Er_xYb_yCe_zA_{(1-x-y-z)})_3RM_3Si_2O_{14}$ crystals as described above;

according to the preparing method of the invention, in step S2, the sintering temperature is 1100 to 1250° C., preferably 1150° C.; the sintering time is 20 to 50 hours, e.g. 30 hours;

according to the preparing method of the invention, in step S3, the growth is carried out in a single crystal growth furnace;

the growth temperature is 1200 to 1400° C., preferably 1270 to 1350° C.;

in the process of crystal growth, the pulling speed is 0.6 to 1.5 mm/h, and the rotation rate for crystal growth is 6 to 15 rpm.

According to the preparing method of the invention, when M is selected from Ga element, or Ga and Al elements, the preparing method further includes: S1'. Adding the compound containing Ga element to the mixture obtained in step S1 again. Then grinding the mixture again and proceeding to step S2;

in step S1' the addition amount of the compound containing Ga element is 0.5 mol % to 2.5 mol % of the compound containing Ga element in step S1, preferably 1.2 mol %;

the grinding time is 12 to 24 hours.

The invention further provides the use of the above-described erbium-doped silicate crystals, which can be used as laser gain media.

According to the invention, the lasers include laser oscillators and laser amplifiers.

According to the invention, the lasers are around wavelength of 1.5 µm, such as 1.5 µm pulse solid-state lasers, 1.5 µm tunable solid-state lasers, 1.5 µm frequency-doubled or self-frequency-doubled solid-state lasers. The 1.5 µm in the invention is between 1.5 and 1.6 µm.

The invention further provides a type of 1.5 µm laser, which comprises a diode laser pumping system, an input mirror, a gain medium and an output mirror, wherein the gain medium is one of the crystals as described above; the diode laser pumping system comprises a 940 nm or 980 nm diode laser and an optical coupler; the gain medium is located between the input mirror and the output mirror.

According to the invention, the optical coupler is arranged between the diode laser and the input mirror;

Preferably, the input mirror has a transmission T≥70% in the pump waveband, and T≤0.5% at 1.5 µm; the output mirror has a transmission 0.5%≤T≤10% at 1.5 µm;

According to the invention, the input and the output mirrors are deposited on the input surface and/or the output surface of the gain medium, respectively.

According to the invention, the laser further includes a 1.5 µm Q-switching or mode-locking element, forming a 1.5 µm pulse solid-state laser.

In one embodiment, the 1.5 µm Q-switching or mode-locking element is located between the gain medium and the output mirror, or the Q-switching and mode-locking element are placed between the gain medium and the output mirror at the same time;

according to the invention, the input mirror is directly deposited on the input surface of the gain medium, and the output mirror is directly deposited on the output surface of the Q-switching or mode-locking element.

The Q-switching element is a passively Q-switched crystal, such as $Co^{2+}:MgAl_2O_4$ crystal, $Co^{2+}:ZnSe$ crystal, $Cr^{2+}:ZnSe$ crystal, etc., or an acousto-optic Q-switched module.

According to the invention, the laser further comprises a wavelength-tunable element around 1.5 µm, forming a tunable solid-state laser around 1.5 µm.

The wavelength-tunable element is located between the gain medium and the output mirror.

The wavelength-tunable element is selected from a birefringent filter, a grating, or a prism, etc.

According to the invention, the laser further comprises a 1.5 µm frequency-doubling crystal, forming a 1.5 µm frequency-doubled laser.

The frequency-doubling crystal is located between the gain medium and the output mirror.

In one embodiment, the output mirror has a transmission T≤0.5% at 1.5 µm, and T≥70% in the frequency-doubled waveband;

according to the invention, the output mirror is directly deposited on the output surface of the frequency-doubling crystal.

The frequency-doubling crystal is a nonlinear optical crystal for a 1.5 µm frequency-doubled laser, such as the KTP crystal, LBO crystal, β-BBO crystal, etc.

According to the invention, the laser is a 1.5 µm self-frequency-doubled solid-state laser. In the laser, the gain medium is used as a self-frequency-doubling laser crystal, wherein the cut angle of the self-frequency-doubling laser crystal is the frequency-doubling phase-matching angle of the emitted fundamental 1.5 µm laser; the input mirror has a transmission 70% at 980 nm, and T≤0.5% at 1.5 µm and in the frequency-doubled waveband; the output mirror has a transmission T≤0.5% at 1.5 µm, and T≥70% in the frequency-doubled waveband.

According to the invention, the input and the output mirrors are deposited on the input and/or the output surfaces of the self-frequency-doubling crystal, respectively.

The technical solution of the invention has the following advantageous effects:

The invention grows $A_3RM_3Si_2O_{14}$ crystals doped with erbium ion at a relatively low temperature by the Czochralski method, which reduces the growth costs and improves the optical quality of the crystals. By using the crystals as gain media, 1.5 µm solid-state continuous-wave lasers with high output power and high efficiency, as well as pulse solid-state lasers with high energy and narrow width can be obtained.

The fluorescence lifetime of the $^4I_{11/2}$ level of $Er^{3+}$ ion in the crystals of the invention is only about 20 µs, and most of the $Er^{3+}$ ion scan be rapidly populated in the upper laser level $^4I_{13/2}$. Therefore, it is beneficial to realize efficient 1.5 µm laser operations, which has been demonstrated in the laser experiments. At the same time, the fluorescence lifetime of the upper laser level $^4I_{13/2}$ of $Er^{3+}$ ions in the crystals is up to 6 ms, which shows that the crystals have excellent energy storage capacities; therefore, pulse lasers with high energy can be achieved in the crystals.

Figure 1:
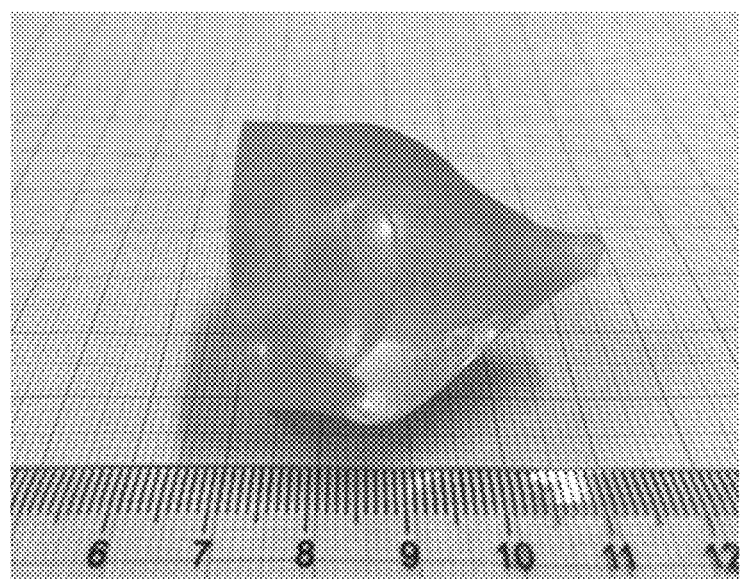
FIG. 1 shows a picture of the $(Er_{0.007}Yb_{0.02}Ce_{0.03}Ca_{0.943})_3NbGa_3Si_2O_{14}$ crystal in Example 4.

The reference numerals in the figures are: 1. 940 nm or 980 nm diode laser; 2. optical coupler; 3. input mirror; 4. gain medium; 5. output mirror; 6. Q-switching or mode-locking element 7. wavelength-tunable element 8. frequency-doubling crystal; self-frequency-doubling laser crystal.

EXAMPLES

The crystals and lasers of the disclosure will be further described in the following in combination with specific embodiments. It should be understood that the following embodiments exemplarily illustrate and explain the disclosure, and should not be interpreted to limit the protection scope of the disclosure. The technologies implemented based on the above-described contents disclosed herein all fall into the protection scope of the disclosure.

Unless otherwise specified, the raw materials and reagents used in the following examples are all commercially available products, or can be prepared by known methods.

EXAMPLE 1

An $(Er_{0.005}Yb_{0.01}Ca_{0.985})_3NbGa_3Si_2O_{14}$ crystal end-pumped by a 976 nm diode laser realizing a solid-state laser at 1.56 µm.

An $(Er_{0.005}Yb_{0.01}Ca_{0.985})_3NbGa_3Si_2O_{14}$ crystal was grown by the Czochralski method, and the specific preparation steps were as follows:

(1) Use $CaCO_3$, $Er_2O_3$, $Yb_2O_3$, $Nb_2O_5$, $Ga_2O_3$ and $SiO_2$ as raw materials, which are mixed together according to the stoichiometric ratio of the crystal formula.

(2) Add $Ga_2O_3$ to the mixture obtained in step (1), the addition amount being 1.2 mol % of $Ga_2O_3$ in step (1).

(3) Grind the mixture for 16 hours, and then press the uniformly ground mixture into tablets; sinter the tablets at 1150° C. for 30 hours, and synthesize to obtain a polycrystalline material after complete reaction.

(4) Put the polycrystalline material into a single crystal growth furnace for carrying out the crystal growth, a growth temperature being 1300° C., a rotation rate being 12 rpm, and a pulling speed being 1.0 mm/h. After the crystal grew to the required size, pull the crystal of f the liquid surface and cool down, a cooling rate being 20° C./h, and then take the crystal out after the temperature in the furnace dropped to room temperature.

The crystal belongs to the trigonal crystal system, the space group is P321, the crystal is uniaxial, and its optical axis is parallel to the crystallographic c-axis. After orientation by using a polarized light microscope, a crystal sample having a pair of smooth surfaces perpendicular to the c-axis was cut and polished. Because the absorption coefficient at pumping wave length of 976 nm is about 3.0 $cm^{-1}$, a 4.0 mm-thick crystal sample (the area of the surface is generally square millimeters to square centimeters) has 70% absorption efficiency. The crystal sample was fixed in a copper chamber with a small hole in the middle of front and rear ends. The chamber was placed in a laser cavity. The input mirror of the laser cavity had a transmission of 90% at 976 nm, and 0.1% at 1.56 µm; the output mirror of the laser cavity had a transmission of 3.0% at 1.56 µm. When end-pumped by a 6 W diode laser at 976 nm, a solid-state laser at 1.56 µm with a continuous-wave output power of more than 500 mW was obtained. The input and output mirrors of the laser cavity can be directly deposited on the input and/or output surfaces of the laser crystal, respectively, to achieve the same purpose.

EXAMPLE 2

An $(Er_{0.006}Yb_{0.015}Ca_{0.979})_3TaGa_3Si_2O_{14}$ crystal end-pumped by a 976 nm diode laser realizing a solid-state laser at 1.56 µm.

An $(Er_{0.006}Yb_{0.015}Ca_{0.979})_3TaGa_3Si_2O_{14}$ crystal was grown by the Czochralski method, and the specific preparation method was referred to Example 1. The crystal is uniaxial, and its optical axis is parallel to the crystallographic c-axis. After orientation by using a polarized light microscope, a crystal sample having a pair of smooth surfaces perpendicular to the c-axis was cut and polished. Because the absorption coefficient at pumping wavelength of 976 nm is about 3.8 $cm^{-1}$, a 3.2 mm-thick crystal sample (the area of the surface is generally square millimeters to square centimeters) has 70% absorption efficiency. The crystal sample was fixed in a copper chamber with a small hole in the middle of front and rear ends. The chamber was placed in a laser cavity. The input mirror of the laser cavity had a transmission of 90% at 976 nm, and 0.1% at 1.56 µm; the output mirror of the laser cavity had a transmission of 2.0% at 1.56 µm. When end-pumped by a 6 W diode laser at 976 nm, a solid-state laser at 1.56 µm with a continuous-wave output power of more than 400 mW was obtained. The input and output mirrors of the laser cavity can be directly deposited on the input and/or output surfaces of the laser crystal, respectively, to achieve the same purpose.

EXAMPLE 3

An $(Er_{0.01}Yb_{0.03}Sr_{0.96})_3TaGa_3Si_2O_{14}$ crystal end-pumped by a 976 nm diode laser realizing a solid-state laser at 1.58 µm.

An $(Er_{0.01}Yb_{0.03}Sr_{0.96})_3TaGa_3Si_2O_{14}$ crystal was grown by the Czochralski method, and the specific preparation method was referred to Example 1. The crystal is uniaxial, and its optical axis is parallel to the crystallographic c axis. After orientation by using a polarized light microscope, a crystal sample having a pair of smooth surfaces perpendicular to the c-axis was cut and polished. Because the absorption coefficient at pumping wavelength of 976 nm is about 7.5 $cm^{-1}$, a 2.1 mm-thick crystal sample (the area of the surface is generally square millimeters to square centimeters) has 80% absorption efficiency. The crystal sample was fixed in a copper chamber with a small hole in the middle of front and rear ends. The chamber was placed in a laser cavity. The input mirror of the laser cavity had a transmission of 90% at 976 nm, and 0.1% at 1.58 µm; the output mirror of the laser cavity had a transmission of 1.0% at 1.58 µm. When end-pumped by a 6 W diode laser at 976 nm, a solid-state laser at 1.58 µm with a continuous-wave output power of more than 200 mW was obtained. The input and output mirrors of the laser cavity can be directly deposited on the input and/or output surfaces of the laser crystal, respectively, to achieve the same purpose.

EXAMPLE 4

An $(Er_{0.007}Yb_{0.02}Ce_{0.03}Ca_{0.943})_3NbGa_3Si_2O_{14}$ crystal end-pumped by a 976 nm diode laser realizing a solid-state laser at 1.56 µm.

Figure 2:
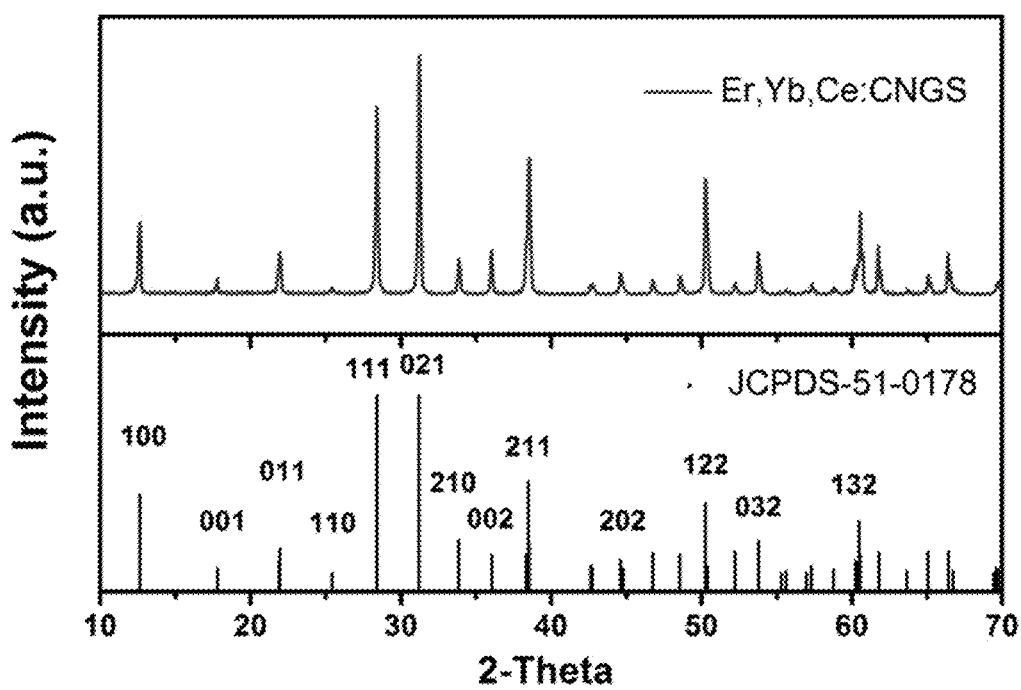
FIG. 2 shows XRD pattern of the $(Er_{0.007}Yb_{0.02}Ce_{0.03}Ca_{0.943})_3NbGa_3Si_2O_{14}$ crystal in Example 4.
Figure 3A:
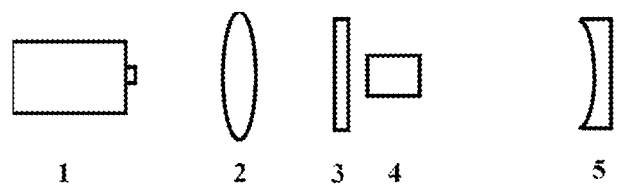
FIG. 3A to FIG. 3E show exemplary laser systems of the current disclosure.
Figure 3B:
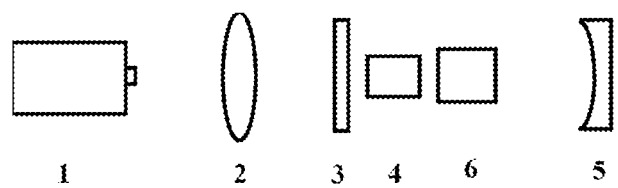
Figure 3C:
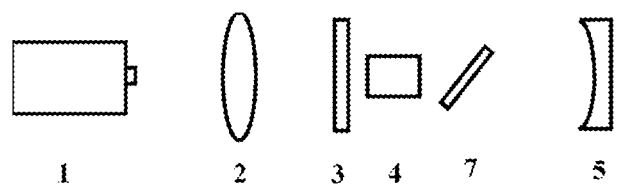
Figure 3D:
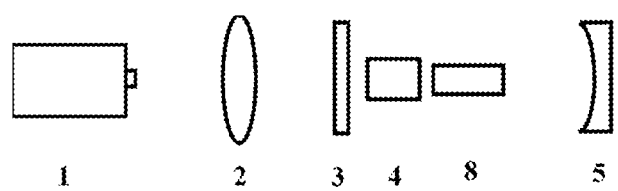
Figure 3E:
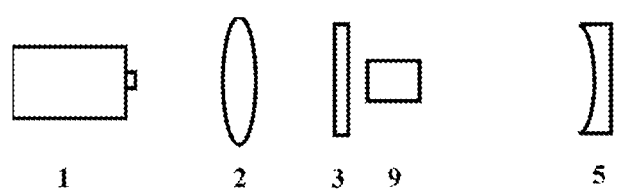

An $(Er_{0.007}Yb_{0.02}Ce_{0.03}Ca_{0.943})_3NbGa_3Si_2O_{14}$ crystal was grown by the Czochralski method, and the specific preparation method was referred to Example 1. The picture of the $(Er_{0.007}Yb_{0.02}Ce_{0.03}Ca_{0.943})_3NbGa_3Si_2O_{14}$ crystal is shown in FIG. 1, and its XRD pattern is indicated in FIG. 2.

The crystal is uniaxial, and its optical axis is parallel to the crystallographic c-axis. After orientation by using a polarized light microscope, a crystal sample having a pair of smooth surfaces perpendicular to the c-axis was cut and polished. Because the absorption coefficient at pumping wavelength of 976 nm is about 4.0 $cm^{-1}$, a 3.0 mm-thick crystal sample (the area of the surface was generally square millimeters to square centimeters) has 70% absorption efficiency. The crystal sample was fixed in a copper chamber with a small hole in the middle of front and rear ends. The chamber was placed in a laser cavity. The input mirror of the laser cavity had a transmission of 90% at 976 nm, and 0.1% at 1.56 µm; the output mirror of the laser cavity had a transmission of 3.4% at 1.56 µm. When end-pumped by a 6 W diode laser at 976 nm, a solid-state laser at 1.56 µm with a continuous-wave output power of more than 600 mW was obtained. The input and output mirrors of the laser cavity can be directly deposited on the input and/or output surfaces of the laser crystal, respectively, to achieve the same purpose.

EXAMPLE 5

An $(Er_{0.005}Yb_{0.04}Ce_{0.06}Ca_{0.895})_3TaAl_3Si_2O_{14}$ crystal end-pumped by a 976 nm diode laser realizing a solid-state laser at 1.56 µm.

An $(Er_{0.005}Yb_{0.04}Ce_{0.06}Ca_{0.895})_3TaAl_3Si_2O_{14}$ crystal was grown by the Czochralski method, and the specific preparation method was similar to that in Example 1, except that in step (1) the raw material $Al_2O_3$ was proportioned in the stoichiometric ratio of the crystal, and step (2) for adding $Al_2O_3$ was not necessary. The crystal is uniaxial, and its optical axis is parallel to the crystallographic c-axis. After orientation by using a polarized light microscope, a crystal sample having a pair of smooth surfaces perpendicular to the c-axis was cut and polished. Because the absorption coefficient at pumping wavelength of 976 nm is about 10 $cm^{-1}$, a 1.5 mm-thick crystal sample (the area of the surface was generally square millimeters to square centimeters) has 78% absorption efficiency. The crystal sample was fixed in a copper chamber with a small hole in the middle of front and rear ends. The chamber was placed in a laser cavity. The input mirror of the laser cavity had a transmission of 90% at 976 nm, and 0.1% at 1.56 μm; the output mirror of the laser cavity had a transmission of 2.7% at 1.56 μm. When end-pumped by a 6 W diode laser at 976 nm, a solid-state laser at 1.56 μm with a continuous-wave output power of more than 500 mW was obtained. The input and output mirrors of the laser cavity can be directly deposited on the input and/or output surfaces of the laser crystal, respectively, to achieve the same purpose.

EXAMPLE 6

An $(Er_{0.012}Yb_{0.08}Ce_{0.13}Sr_{0.778})_3NbGa_3Si_2O_{14}$ crystal end-pumped by a 976 nm diode laser realizing a solid-state laser at 1.56 μm.

An $(Er_{0.012}Yb_{0.08}Ce_{0.13}Sr_{0.778})_3NbGa_3Si_2O_{14}$ crystal was grown by the Czochralski method, and the specific preparation method was referred to Example 1. The crystal is uniaxial, and its optical axis is parallel to the crystallographic c axis. After orientation by using a polarized light microscope, a crystal sample having a pair of smooth surfaces perpendicular to the c-axis was cut and polished. Because the absorption coefficient at pumping wavelength of 976 nm is about 20 $cm^{-1}$, a 1.0 mm-thick crystal sample (the area of the surface was generally square millimeters to square centimeters) has 86% absorption efficiency. The crystal sample was fixed in a copper chamber with a small hole in the middle of front and rear ends. The chamber was placed in a laser cavity. The input mirror of the laser cavity had a transmission of 90% at 976 nm, and 0.1% at 1.56 m; the output mirror of the laser cavity had a transmission of 4.2% at 1.56 μm. When end-pumped by a 6 W diode laser at 976 nm, a solid-state laser at 1.56 μm with a continuous-wave output power of more than 500 mW was obtained. The input and output mirrors of the laser cavity can be directly deposited on the input and/or output surfaces of the laser crystal, respectively, to achieve the same purpose.

EXAMPLE 7

An $(Er_{0.007}Yb_{0.02}Ce_{0.03}Ca_{0.943})_3NbAl_3Si_2O_{14}$ crystal end-pumped by a 976 nm diode laser realizing a solid-state laser at 1.56 μm.

An $(Er_{0.007}Yb_{0.02}Ce_{0.03}Ca_{0.943})_3NbAl_3Si_2O_{14}$ crystal was grown by the Czochralski method, and the specific preparation method was similar to that in Example 1, except that in step (1) the raw material $Al_2O_3$ was proportioned in the stoichiometric ratio of the crystal, and step (2) for adding $Al_2O_3$ was not necessary. The crystal is uniaxial, and its optical axis is parallel to the crystallographic c axis. After orientation by using a polarized light microscope, a crystal sample having a pair of smooth surfaces perpendicular to the c-axis was cut and polished. Because the absorption coefficient at pumping wavelength of 976 nm is about 4.0 $cm^1$, a 3.0 mm-thick crystal sample (the area of the surface was generally square millimeters to square centimeters) has 70% absorption efficiency. The crystal sample was fixed in a copper chamber with a small hole in the middle of front and rear ends. The chamber was placed in a laser cavity. The input mirror of the laser cavity had a transmission of 90% at 976 nm, and 0.1% at 1.56 μm; the output mirror of the laser cavity had a transmission of 3.4% at 1.56 μm. When end-pumped by a 6 W diode laser at 976 nm, a solid-state laser at 1.56 μm with a continuous-wave output power of more than 600 mW was obtained. The input and output mirrors of the laser cavity can be directly deposited on the input and/or output surfaces of the laser crystal, respectively, to achieve the same purpose.

EXAMPLE 8

An $Er^{3+}$-doped silicate crystal end-pumped by a 976 nm diode laser realizing a pulse solid-state laser near 1.56 μm.

When a 1.5 μm passively Q-switched crystal (such as a $Co^{2+}:MgAl_2O_4$ crystal, a $Co^{2+}:ZnSe$ crystal, a $Cr^{2+}:ZnSe$ crystal, etc.), or an acousto-optic Q-switched module was directly inserted between anyone laser crystal of Examples 1 to 7 and the output mirror, a Q-switched pulse laser near 1.56 μm could be realized. The input mirror can further be directly deposited on the input surface of the gain medium, and the output mirror can be directly deposited on the output surface of the Q-switching or mode-locking element, respectively, to achieve the same purpose.

EXAMPLE 9

An $Er^{3+}$-doped silicate crystal end-pumped by a 976 nm diode laser realizing a tunable solid-state laser between 1530-1580 nm.

Any one laser crystal of Examples 1 to 7 was fixed in a copper chamber with a small hole in the middle of front and rear ends. The chamber was placed in a laser cavity. The input mirror of the laser cavity had a transmission of 90% at 976 nm, and 0.1% between 1.5-1.6 μm; the output mirror of the laser cavity had a transmission of 1.0% between 1.5-1.6 μm. A tunable element around wavelength of 1.5 μm (such as a birefringent filter, a grating, a prism, etc.) was inserted between the laser crystal and the output mirror of the laser cavity to achieve a tunable solid-state laser at 1530-1580 nm when the laser crystal was end-pumped by a 976 nm diode laser.

EXAMPLE 10

An $Er^{3+}$-doped silicate crystal end-pumped by a 976 nm diode laser realizing a frequency-doubled solid-state laser at 790 nm.

A nonlinear optical crystal for a 1.5 μm frequency-doubled laser (such as a K TP crystal, an LBO crystal, a β-BBO crystal, etc.) was directly inserted between any one laser crystal of Examples 1 to 7 and the output mirror. The input mirror of the laser cavity had a transmission of 90% at 976 nm, and 0.1% at 1.58 μm and 790 nm; the output mirror had a transmission of 0.3% at 1580 nm and 80% at 790 nm. A frequency-doubled laser at 790 nm could be achieved when the the laser crystal was end-pumped by a 976 nm diode laser. The input mirror can further be directly deposited on the input surface of the gain medium, and the output mirror can be directly deposited on the output surface of the nonlinear optical crystal, respectively, to achieve the same purpose.

EXAMPLE 11

An $(Er_{0.007}Yb_{0.02}Ce_{0.03}Ca_{0.943})_3NbGa_3Si_2O_{14}$ crystal end-pumped by a 976 nm diode laser realizing a self-frequency-doubled solid-state laser at 790 nm.

The $(Er_{0.007}Yb_{0.02}Ce_{0.03}Ca_{0.943})_3NbGa_3Si_2O_{14}$ laser crystal in Example 4 was used as a self-frequency-doubling crystal, which was fixed in a copper chamber with a small hole in the middle of front and rear ends. The chamber was placed in a laser cavity. The cut angles of the type I phase-matching direction of the self-frequency-doubling crystal were θ=27.5°, o=30°. The input mirror of the laser cavity had a transmission of 90% at 976 nm, and 0.1% at 1.58 μm and 790 nm; the output mirror had a transmission of 0.3% at 1.58 μm and 80% at 790 nm. A self-frequency-doubled laser at 790 nm could be achieved when the laser crystal was end-pumped by a 976 nm diode laser. The input and output mirrors of the laser cavity can be directly deposited on the input and/or output surfaces of the self-frequency-doubling laser crystal, respectively, to achieve the same purpose.

The embodiments of the disclosure are described above. However, the disclosure is not limited to the above-described embodiments. Any modification, equivalent alternative, improvement, etc., made within the spirit and principles of the disclosure, are intended to be included within the scope of the disclosure.

We claim:

1. An erbium-doped silicate crystal having a general chemical formula of $(Er_xYb_yCe_zA_{(1-x-y-z)})_3RM_3Si_2O_{14}$, wherein x is 0.002 to 0.02, y is 0.005 to 0.10, z is 0 to 0.15; A is selected from Sr, Ba, and combinations thereof; R is selected from Nb, Ta, and combinations thereof; and M is selected from Al, Ga, and combinations thereof.

2. The erbium-doped silicate crystal of claim 1 belongs to a trigonal crystal system and is P321 space group.

3. A method of preparing the erbium-doped silicate crystal of claim 1, comprising:
    S1: mixing and grinding a compound containing Er, a compound containing Yb, a compound containing Ce, a compound containing A, a compound containing R, a compound containing M, and a compound containing Si;
    S2: sintering a mixture obtained from step S1 to obtain a polycrystalline material; and
    S3: carrying out a crystal growth of the polycrystalline material obtained in step S2;
    wherein, the A, R, M are defined in claim 1,
    wherein, in step S1,
    the compound containing Er is selected from oxides of Er and $Er_2O_3$;
    the compound containing Yb is selected from oxides of Yb and $Yb_2O_3$;
    the compound containing Ce is selected from oxides of Ce and $CeO_2$;
    the compound containing Si is selected from oxides of Si and $SiO_2$;
    the compound containing A is selected from carbonates of A, $SrCO_3$, $BaCO_3$, and combinations thereof, and
    the compound containing R is selected from oxides of R, $Nb_2O_5$, $Ga_2O_3$, and combinations thereof.

4. The method of claim 3, wherein, in step S2, the sintering temperature is 1100 to 1250° C.

5. The method of claim 3, wherein, in step S3, the growth temperature is 1200 to 1400° C., and in the process of crystal growth, a pulling speed of the crystal is 0.6 to 1.5 mm/h, and a rotation rate for the crystal is 6 to 15 rpm.

6. The method of claim 3, wherein, when M is Ga, step S1 comprises:
    mixing and grinding the compound containing Er, the compound containing Yb, the compound containing Ce, the compound containing A, the compound containing R, a first amount of the compound containing Ga, and the compound containing Si to obtain a first mixture;
    adding a second amount of the compound containing Ga to the first mixture and then grinding to obtain the mixture,
    wherein the second amount of the compound containing Ga is 0.5 mol % to 2.5 mol % of the first amount of the compound containing Ga.

7. The method of claim 6, wherein the second amount of the compound containing Ga is 1.2 mol % of the first amount of the compound containing Ga.

8. A laser, comprising: a laser gain medium that is the erbium-doped silicate crystal according to claim 1, a laser oscillator, and a laser amplifier.

9. The laser of claim 8, having a wavelength of 1.5 μm, wherein the laser is a 1.5 μm pulse solid-state laser, a 1.5 μm tunable solid-state laser, a 1.5 μm frequency-doubled, or a 1.5 μm self-frequency-doubled solid-state laser.

10. A laser comprises a diode laser pumping system, an input mirror, a gain medium, and an output mirror; the gain medium is the erbium-doped silicate crystal of claim 1; the diode laser pumping system comprises a 940 nm or 980 nm diode laser and an optical coupler; the gain medium is located between the input mirror and the output mirror.

11. The laser of claim 10, wherein the laser further comprises a 1.5 μm Q-switching or a mode-locking element
    located between the gain medium and the output mirror, or the Q-switching and the mode-locking element are placed between the gain medium and the output mirror, the input mirror is directly deposited on the input surface of the gain medium, and the output mirror is directly deposited on the output surface of the Q-switching or the mode-locking element,
    wherein the Q-switching element is selected from a passively Q-switched crystal, a $Co^{2+}$: $MgAl_2O_4$ crystal, a $Co^{2+}$: ZnSe crystal, a $Cr^{2+}$: ZnSe crystal, and an acousto-optic Q-switched module.

12. The laser of claim 10, wherein the laser further comprises a wavelength-tunable element around 1.5 μm located between the gain medium and the output mirror, and wherein the wavelength-tunable element is a birefringent filter, a grating, or a prism.

13. The laser of claim 10, wherein the laser further comprises a 1.5 μm frequency-doubling crystal.

14. The laser of claim 10, wherein the laser is a 1.5 μm self-frequency-doubled solid-state laser using the gain medium as a self-frequency-doubling laser crystal, wherein a cut angle of the self-frequency-doubling laser crystal is a frequency-doubling phase-matching angle of an emitted fundamental 1.5 μm laser; the input mirror has a transmission T≥70% at 980 nm, and T≤0.5% at 1.5 μm and in the frequency-doubled waveband; the output mirror has a transmission T 0.5% at 1.5 μm, and T≥70% in the frequency-doubled waveband.

15. The laser of claim 10, wherein the optical coupler is arranged between the diode laser and the input mirror, wherein the input mirror has a transmission T≥70% in a pump waveband, and T≤0.5% at 1.5 μm, and the output mirror has a transmission 0.5% T≤10% at 1.5 μm, wherein the input mirror and the output mirror are disposed on the input surface of the gain medium and on the output surface of the gain medium, respectively.

16. The erbium-doped silicate crystal of claim 1, wherein R is Ta.

17. An erbium-doped silicate crystal having a general chemical formula of $(Er_xYb_yCe_zA_{(1-x-y-z)})_3RM_3Si_2O_{14}$, wherein x is 0.002 to 0.02, y is 0.005 to 0.10, z is 0 to 0.15; A is selected from Ca, Sr, Ba, and combinations thereof; R is selected from Nb, Ta, and combinations thereof, and M is Al.

18. A laser, comprising: a laser gain medium that is the erbium-doped silicate crystal according to claim 17, a laser oscillator, and a laser amplifier.

19. The laser of claim 18, having a wavelength of 1.5 μm, wherein the laser is a 1.5 μm pulse solid-state laser, a 1.5 μm tunable solid-state laser, a 1.5 μm frequency-doubled, or a 1.5 μm self-frequency-doubled solid-state laser.

20. A laser comprises a diode laser pumping system, an input mirror, a gain medium, and an output mirror; the gain medium is the erbium-doped silicate crystal of claim 18; the diode laser pumping system comprises a 940 nm or 980 nm diode laser and an optical coupler; the gain medium is located between the input mirror and the output mirror.

21. The laser of claim 20, wherein the laser further comprises a 1.5 μm Q-switching or a mode-locking element located between the gain medium and the output mirror, or the Q-switching and the mode-locking element are placed between the gain medium and the output mirror, the input mirror is directly deposited on the input surface of the gain medium, and the output mirror is directly deposited on the output surface of the Q-switching or the mode-locking element,
wherein the Q-switching element is selected from a passively Q-switched crystal, a $Co^{2+}$: $MgAl_2O_4$ crystal, a $Co^{2+}$: ZnSe crystal, a $Cr^{2+}$: ZnSe crystal, and an acousto-optic Q-switched module.

22. The laser of claim 20, wherein the laser further comprises a wavelength-tunable element around 1.5 μm located between the gain medium and the output mirror, and wherein the wavelength-tunable element is a birefringent filter, a grating, or a prism.

23. The laser of claim 20, wherein the laser further comprises a 1.5 μm frequency-doubling crystal.

24. The laser of claim 20, wherein the laser is a 1.5 μm self-frequency-doubled solid-state laser using the gain medium as a self-frequency-doubling laser crystal, wherein a cut angle of the self-frequency-doubling laser crystal is a frequency-doubling phase-matching angle of an emitted fundamental 1.5 μm laser; the input mirror has a transmission T≥70% at 980 nm, and T≤0.5% at 1.5 μm and in the frequency-doubled waveband; the output mirror has a transmission T≤0.5% at 1.5 μm, and T≥70% in the frequency-doubled waveband.

* * * * *